(12) United States Patent
Yu et al.

(10) Patent No.: US 11,003,829 B2
(45) Date of Patent: May 11, 2021

(54) ANTENNA PROTECTION CELL

(71) Applicant: Taiwan Semiconductor Manufacturing Company, Ltd., Hsinchu (TW)

(72) Inventors: Kenan Yu, Hsinchu (TW); James Deng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/100,677

(22) Filed: Aug. 10, 2018

(65) Prior Publication Data

US 2020/0050731 A1    Feb. 13, 2020

(51) Int. Cl.
*G06F 30/394*    (2020.01)
*H01L 27/02*    (2006.01)
*G06F 30/36*    (2020.01)
*G06F 30/398*    (2020.01)

(52) U.S. Cl.
CPC .......... *G06F 30/394* (2020.01); *G06F 30/36* (2020.01); *G06F 30/398* (2020.01); *H01L 27/0207* (2013.01); *H01L 2223/6677* (2013.01)

(58) Field of Classification Search
CPC ...................................................... G06F 30/394
USPC ............................................................ 716/115
See application file for complete search history.

(56) References Cited

U.S. PATENT DOCUMENTS

| | | | |
|---|---|---|---|
| 2002/0083405 A1* | 6/2002 | Ishikura | G06F 17/5072 716/112 |
| 2008/0141198 A1* | 6/2008 | Chen | G06F 17/5036 716/102 |
| 2015/0178433 A1* | 6/2015 | Sakuda | H01L 27/11807 257/401 |
| 2017/0186691 A1* | 6/2017 | Yang | G06F 30/373 |
| 2017/0243788 A1* | 8/2017 | Shimbo | H01L 21/82 |

* cited by examiner

*Primary Examiner* — Eric D Lee
(74) *Attorney, Agent, or Firm* — Merchant & Gould P.C.

(57) ABSTRACT

A cell library stores a plurality of standard layout cells. A functional integrated circuit design is received, and a plurality of the standard layout cells are selected from the cell library based on the received functional integrated circuit design. A first standard layout cell from the cell library that is selected based on the received functional integrated circuit design includes a buffer circuit having an input terminal, an output terminal, a first voltage terminal and a second voltage terminal, and an antenna protection circuit connected between the input terminal and the second voltage terminal.

20 Claims, 4 Drawing Sheets

ANTENNA PROTECTION CELL

BACKGROUND

Integrated circuits typically include thousands of components having complex interrelationships. These circuits are generally designed using highly automated processes known as electronic design automation (EDA). EDA begins from a functional specification provided in a hardware description language (HDL) and continues through the specification of a circuit design including the specification of elementary circuit components called cells, the physical arrangement of the cells, and the wiring that interconnects the cells. The cells implement logic or other electronic functions using a particular integrated circuit technology.

EDA can be divided into a series of stages such as synthesis, placement, routing, etc. Each of these steps can involve selecting cells from a library of cells. Typically, a very large number of different circuit designs using various cell combinations can meet a functional specification for a circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic Design Automation (EDA) tools and methods facilitate the design, partition, and placement of microelectronic integrated circuits on a semiconductor substrate. This process typically includes turning a behavioral description of the circuit into a functional description, which is then decomposed into logic functions and mapped into cells using a standard cell library. Once mapped, a synthesis is performed to turn the structural design into a physical layout, a clock tree is built to synchronize the structural elements, and the design is optimized post layout.

Figure 1:
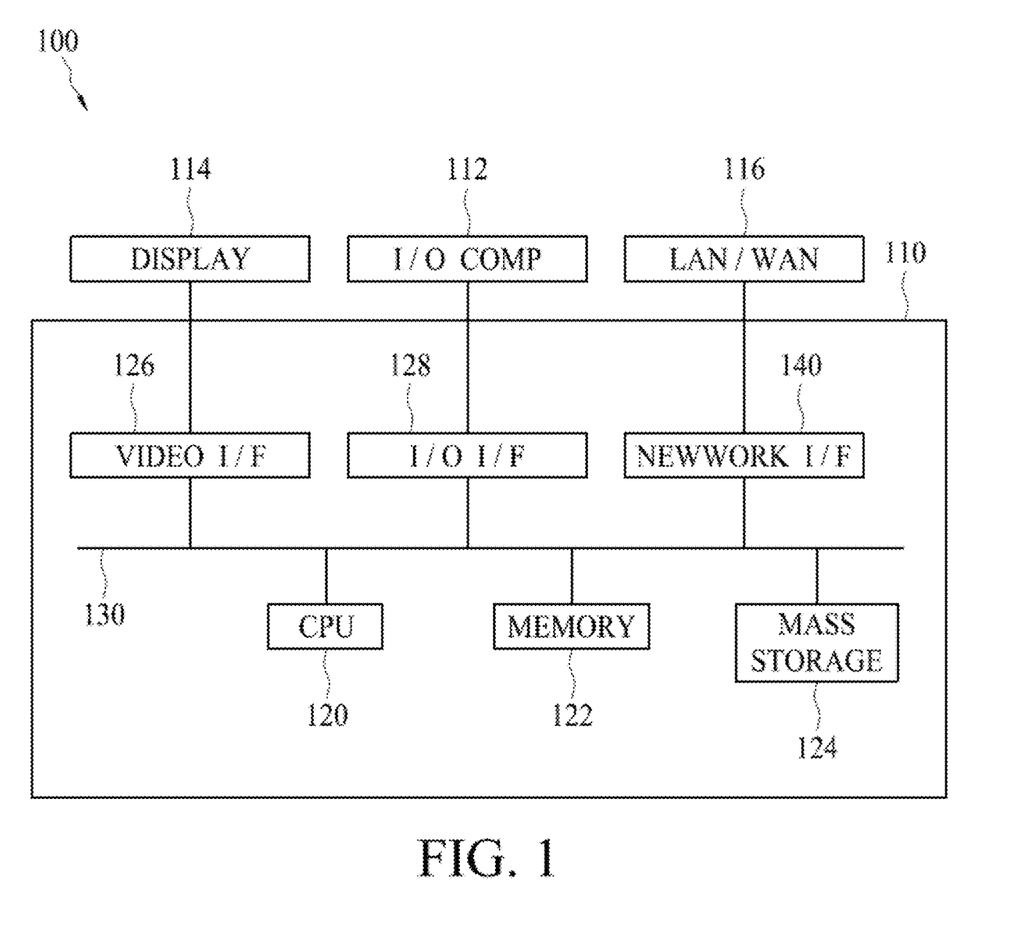
FIG. 1 is a block diagram illustrating aspects of an example processing system in accordance with some embodiments.

FIG. 1 is a block diagram illustrating an example of a processing system 100 in accordance with some embodiments disclosed herein. The processing system 100 may be used to implement an EDA system in accordance with various processes discussed herein. The processing system 100 includes a processing unit 110, such as a desktop computer, a workstation, a laptop computer, a dedicated unit customized for a particular application, a smart phone or tablet, etc. The processing system 100 may be equipped with a display 114 and one or more input/output devices 112, such as a mouse, a keyboard, touchscreen, printer, etc. The processing unit 110 also includes a central processing unit (CPU) 120, memory 122, a mass storage device 124, a video adapter 126, and an I/O interface 128 connected to a bus 130.

The bus 130 may be one or more of any type of several bus architectures including a memory bus or memory controller, a peripheral bus, or video bus. The CPU 120 may comprise any type of electronic data processor, and the memory 122 may comprise any type of system memory, such as static random access memory (SRAM), dynamic random access memory (DRAM), or read-only memory (ROM).

The mass storage device 124 may comprise any type of storage device configured to store data, programs, and other information and to make the data, programs, and other information accessible via the bus 130. The mass storage device 124 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. The memory 122 and mass storage device 124 are computer storage media examples (e.g., memory storage). The mass storage device may further store a library of standard cells, as will be discussed further herein below.

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the processing device 100. Any such computer storage media may be part of the processing device 100. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The video adapter 126 and the I/O interface 128 provide interfaces to couple external input and output devices to the processing unit 110. As illustrated in FIG. 1, examples of input and output devices include the display 114 coupled to the video adapter 126 and the I/O device 112, such as a mouse, keyboard, printer, and the like, coupled to the I/O interface 128. Other devices may be coupled to the processing unit 110, and additional or fewer interface cards may be utilized. For example, a serial interface card (not shown) may be used to provide a serial interface for a printer. The processing unit 110 also may include a network interface 140 that may be a wired link to a local area network (LAN) or a wide area network (WAN) 116 and/or a wireless link.

Embodiments of the processing system 100 may include other components. For example, the processing system 100 may include power supplies, cables, a motherboard, removable storage media, cases, and the like. These other components, although not shown, are considered part of the processing system 100.

In some examples, software code is executed by the CPU 120 to analyze a user design to create a physical integrated circuit layout. The software code may be accessed by the CPU 120 via the bus 130 from the memory 122, mass storage device 124, or the like, or remotely through the network interface 140. Further, in some examples, the physical integrated circuit layout is created based on a functional integrated circuit design, which may be received though the I/O interface 128 and/or stored in the memory 122 or 124 in accordance with various methods and processes implemented by the software code.

Based on the received functional circuit description, the system 100 is configured to select standard cells from the cell library. Generally, transistors are formed into primitive circuits that perform digital logic functions such as AND, OR, NAND, NOR, etc. The primitive circuits are then organized into macro circuits such as multiplexers, adders, multipliers, decoders, etc., which in turn are organized as functional blocks. In a hierarchical design, the functions of the integrated circuit design are allocated space on the semiconductor substrate. Each of the individual functions is then partitioned into the various macro circuits which are often predesigned and placed in the standard cell library of the EDA system.

A general floor plan is determined in which the standard cells, taken from the library of cells, are laid out on the chip real estate. After the placement of the standard cells is determined, a routing step is performed in which electrical conductors are laid out or "routed" on the chip in order to interconnect the electronic modules with each other and with peripheral contact pads that are used to connect the IC with external circuitry. More specifically, during circuit layout synthesis, routing typically involves the connection of N-Type and P-Type transistors and signal input/output ports using electrical connections and applicable layers according to the electrical connectivity of the circuit being laid out. The applicable layers for interconnection usually include polysilicon, diffusion and metal.

The EDA routing uses metal layers to connect all cells as wires. In general, the metal layers used for routing starts from metal 1 layer, metal 2 layer, metal 3 layer, up to metal 12 layer depending on the design requirement, for example. Higher metal layer numbers represent higher metal layers. Thus, the higher the metal layer number, the higher the physical metal layer. For example, metal 5 layer is higher than metal 1 layer, metal 2 layer, metal 3 layer and metal 4 layer. During the chip manufacture process, the higher metal layers are typically formed after the lower metal layers are manufactured. For example, the metal 2 layer is formed after the metal 1 layer is manufactured.

Following the placement and routing, a series of design rule checks are performed to determine whether any of a number of known design rules have been violated by the final placement and routing. One of these design rules involves so-called "antenna rule violations." Antenna rule violations are related to a phenomenon in which certain of the routed conductors act as antennas that attract and store an electrical charge that is developed during the manufacturing process, typically during plasma etching. Plasma etching is a technique widely used in the fabrication of integrated circuits, wherein reactive ions are generated in an ion discharge and accelerated by an electrical field. These ions collide with the wafer surface carrying the semiconductor device being fabricated. The glow discharge used in plasma etching typically results in electrically charging some regions over the wafer surface. This charging can occur in a conductive layer region, for example at the poly-silicon gate formed over the surface of the wafer. A conductor line connected to the gate can act as antenna to store a charge during the etching process, thereby amplifying the charging effect. The static charge stored in the conductors connected to the input gates of transistors can ultimately discharge to the gate inputs, thereby destroying the transistor as well as the IC during the fabrication process. In order to avoid possible damage to the input gates caused by electrostatic discharge due to the antenna effect, protective diodes are sometimes installed at the input gates of transistors. These diodes are referred to as "antenna diodes" since they provide a discharge path to ground for the charges stored in the offending conductors. In order to "insert" antenna diodes in a circuit to correct an antenna rule violation, the standard cells forming part of the library of cells used by the EDA tool include antenna diode cells.

Moreover, in a synchronous logic design, a common timing signal or clock is employed to insure that the circuitry functions correctly. The clock is distributed to each of the registers or latches within the functions and ideally arrives at each of the latches simultaneously during operation.

However, there are differences in the distribution of the clock which causes variation in the arrival of the clock at each of the registers or latches. This variation is referred commonly as "clock skew".

In general, a clock generator provides the clock timing signal used to provide the synchronization of the data being transferred to and transferred from the registers. The clock timing signal is transferred through a clock distribution system or clock tree from the clock generator to the registers. The clock distribution system or clock tree includes a series of buffer circuits placed in a network of subtrees. Each buffer is generally a driver circuit constructed to provide an increment of delay to the clock timing signal and sufficient drive for the number of buffers in the next layer of buffers. In a typical hierarchical design, there are thousands of ports in every hierarchical block. As noted above, the general methodology of isolating the timing between hierarchical blocks is to provide buffers, which are coupled on each input port.

To address antenna rule violations described above between the hierarchical blocks, antenna diodes are inserted on each input port. However, as also noted above, a series of buffers is typically also connected to the input ports. The buffers tend to use much of the placement spacing near the input ports. This can result in the antenna diodes being placed far away from the ports. To correct additional delays caused by the long distance between the antenna diode and the input, the EDA tool may insert additional buffers between the input port and the antenna diode cell, which diminishes the antenna protection on the port.

Still further, if the wires connecting the antenna diode are located in higher metal layers than the metal layers connecting the buffer, the antenna protection function of this diode will fail. This problem can be exacerbated because such interface issues are found at the chip level, and not at the hierarchical block level where they are fixed.

In accordance with disclosed examples, a standard cell library includes standard cells defining circuit elements configured to address placement spacing issues and routing resources resulting from buffer circuits and antenna protection circuits. In some implementations, standard cells combine a first circuit element, such as a buffer, with an antenna protection circuit, such as a diode. Further, the buffer and diode are connected together in the standard cell layout. This reduces the timing impact on the circuit input port, while improving the antenna protection function.

Figure 2:
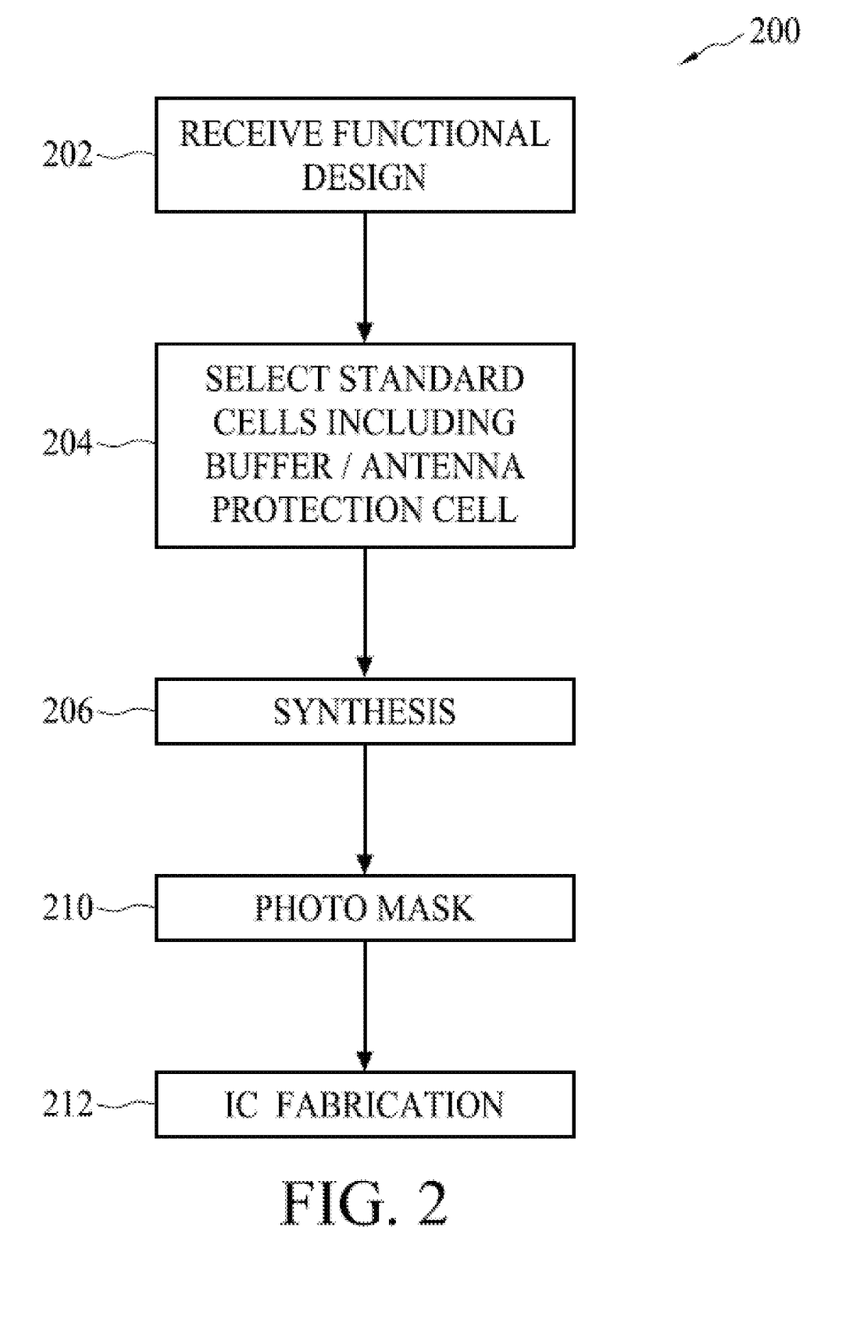
FIG. 2 is process flow diagram illustrating aspects of an example integrated circuit design method in accordance with some embodiments.

FIG. 2 generally illustrates an example integrated circuit design process 200 that may be implemented by the processing system 100 for generating a physical layout from a user supplied behavioral/functional design. At an operation 202, a functional design is received by the system 100 specifies the desired behavior or function of the circuit based upon various signals or stimuli applied to the inputs of the overall design, and may be written in a suitable programming language. The design 202 may be uploaded into the processing unit 110 (see FIG. 1) through the I/O interface 128 by a user. Alternatively, the design 202 may be uploaded and/or saved on the memory 122 or mass storage device 124, or the design 202 may be uploaded through the network interface 140 from a remote user.

At an operation 204, standard layout cells are selected from a standard cell library based on the received functional integrated circuit design. The standard cell library may be stored in the memory 122 or mass storage device 124, or the cell library may be saved in an external memory or system and accessed by the processor 110 through the network interface 140. In the illustrated example, the cell library contains a listing of pre-designed components, or cells, each of which may perform a discrete logic function. The cells are stored in the cell library as information comprising internal circuit elements, the various connections to these circuit elements, a pre-designed physical layout pattern that includes the unit height of each cell along with the cell's designed power rails, dopant implants, wells, etc. Additionally, the stored cell may also comprise a shape of the cell, terminal positions for external connections, delay characteristics, power consumption, etc.

Moreover, in accordance with certain disclosed embodiments, the cell library includes a first standard cell that has a first circuit element that has an input terminal, an output terminal, a first voltage terminal, and a second voltage terminal, as well as an antenna protection circuit connected between the input terminal and the second voltage terminal. In some embodiments, the standard cell library includes various sizes of the first standard cell.

A synthesis is performed on the design in an operation 206, in which the behavior and/or functions desired from the received design 202 are transformed to a functionally equivalent logic gate-level circuit description by matching the design to the standard cells selected from the cell libraries in operation 204. The synthesis 206 results in a functionally equivalent logic gate-level circuit description, such as a gate-level netlist. Based on the gate-level netlist, a photolithographic mask may be generated in an operation 210, which is used to fabricate the integrated circuit as shown in operation 212.

Figure 3:
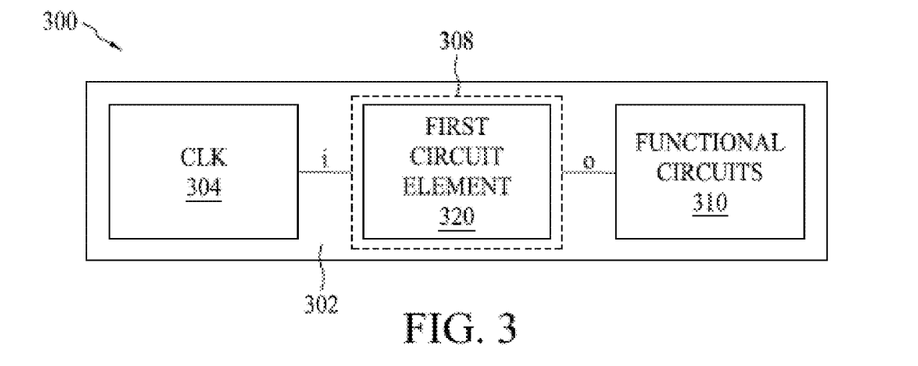
FIG. 3 is a block diagram illustrating aspects of an example integrated circuit in accordance with some embodiments.

FIG. 3 illustrates an example of an integrated circuit 300 that includes a substrate 302 with a plurality of functional circuit elements 310 formed in or on the substrate 302. For synchronized integrated circuit designs, data transfer between functional elements 310 of the circuit are synchronized by one or more clock signals that are provided via a clock tree 308 that includes a plurality of buffer circuits. FIG. 3 illustrates a first circuit element 320 that includes a buffer circuit, as well as an antenna protection circuit as will be discussed further below. For simplicity, only one first circuit element 320 is shown in FIG. 3. However, a typical clock tree 308 could include many buffers circuits.

The clock tree 308, couples a clock source 304 to the functional circuit elements 310. The clock source 304 can manifest as a phase-locked loop (PLL), crystal oscillator, or other type of on-chip oscillator or off-chip oscillator. The circuit elements 310 each receive the clock signal via the clock tree 308. The circuit elements 310 could include, for example, flip-flops which each have a data-in terminal (Di), a data-out terminal (Do) and a clock terminal. Such flip-flops may be connected to synchronous or asynchronous circuits to achieve a suitable circuit function. In some embodiments, the functional circuit elements may further include volatile memories (such as SRAM, DRAM, etc.) and/or nonvolatile memories (such as flash, MRAM, RRAM, PCRAM, FRAM, etc.).

The clock tree 308 is coupled to the coupled to the clock source 304, and in some examples may include branch points at which a clock line splits into two or more clock lines. For simplicity, such branch points are not shown in FIG. 3. One or more buffer circuits of the first circuit element 320 are arranged on various clock lines within the clock tree 308. For example, the buffer circuit of the first circuit element 320 has an input (i) and an output (o). The buffer circuits 320 may be sized to deliver different respective output currents based on their respective locations in the clock tree 308. For instance, the buffer circuit may include transistors that are sized to deliver a desired output current level from the output o.

Figure 4:
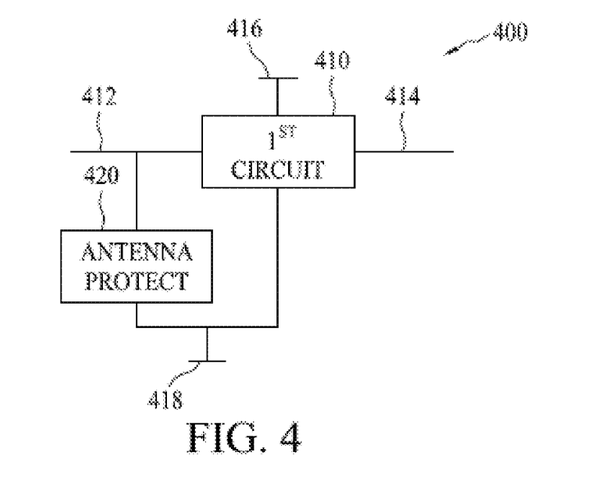
FIG. 4 is a block diagram illustrating a circuit element of the integrated circuit shown in FIG. 3, in accordance with some embodiments.

FIG. 4 illustrates further aspects of the first circuit element 320. The first circuit element 320 is defined by a corresponding first standard layout cell 400, which is part of a standard cell library as discussed above. The first standard layout cell 400, and thus the first circuit element 320, has a first circuit 410 with an input terminal 412, an output terminal 414, a first voltage terminal 416, and a second voltage terminal 418. Additionally, the first standard layout cell 400 has an antenna protection circuit 420 connected between the input terminal 412 and the second voltage terminal 418.

Figure 5:
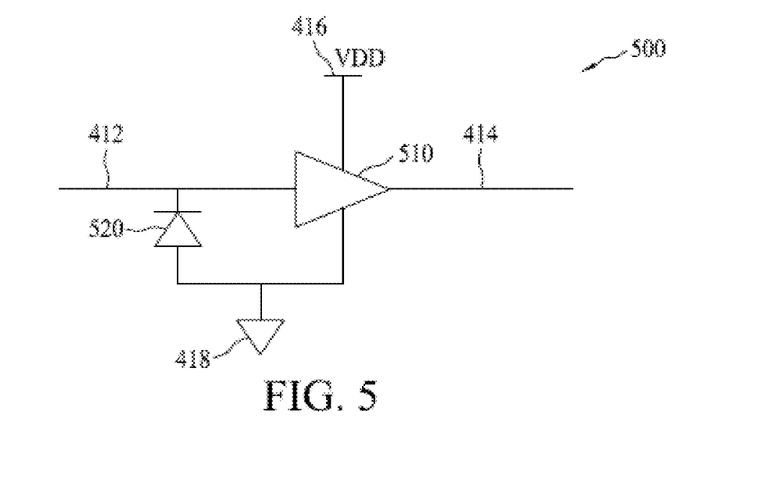
FIG. 5 is a block diagram illustrating aspects of an example of a first standard layout cell in accordance with some embodiments.

In the example disclosed in conjunction with FIG. 3, the first circuit element 320 includes a buffer, which may be a component of a clock tree. FIG. 5 illustrates an example of a first standard layout cell 500 in which the first circuit 410 is an input buffer 510, and the antenna protection circuit 420 comprises a diode 520 connected between the input terminal 412 and the second voltage terminal 418. In some embodiments, the first voltage terminal 416 is a VDD terminal that is configured to receive a source voltage VDD, and the second terminal 418 is a VSS, or ground terminal. Thus, the antenna diode 520 is connected in a reverse bias condition, with its cathode connected to the input terminal 412 and its anode connected to the VSS or ground terminal 418.

Figure 6:
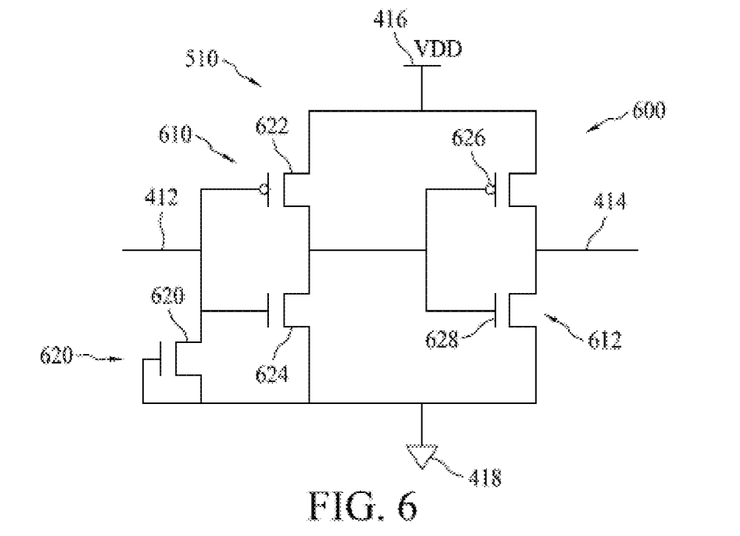
FIG. 6 is a circuit diagram illustrating further aspects of an example of a first standard layout cell in accordance with some embodiments.

FIG. 6 illustrates an example of a first layout cell 600 where the buffer 510 includes first and second inverters 610, 612, though the buffer 510 is not necessarily limited to being comprised of inverters. The first inverter 610 is made up of a first NMOS transistor 624 and a first PMOS transistor 622, whose gate electrodes are connected to the input terminal 412 so as to receive an input signal therefrom. The source/drain regions of the NMOS transistor 624 and first PMOS transistor 622 are configured to deliver an output signal, which is received by an input terminal of the second inverter 612.

As noted previously, the antenna diode 520 is connected between the input terminal 412 and the second voltage terminal, or ground terminal 418. In the example illustrated in FIG. 6, the antenna diode 520 is implemented by a diode-connected NMOS transistor 620.

The inverter 612 is made up of a second NMOS transistor 628 and a second PMOS transistor 626, whose gate electrodes receive the output of the first inverter 610, and whose source/drain regions are coupled to the output terminal 414 to deliver the output signal of the circuit element.

Figure 7:
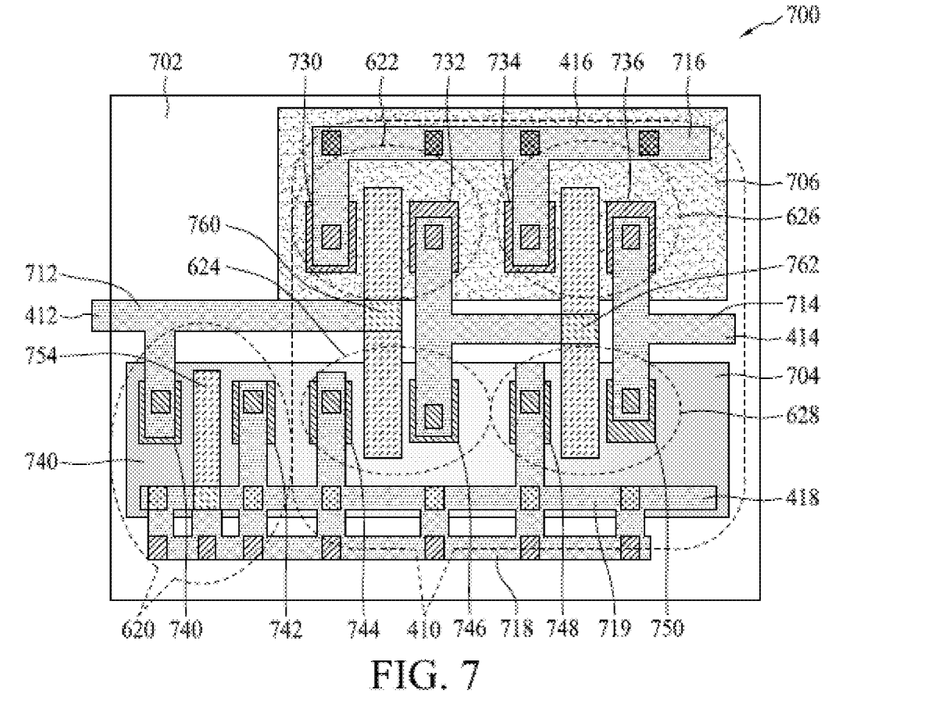
FIG. 7 is a block diagram illustrating aspects of an example of an integrated circuit layout for the first standard layout cell shown in FIG. 6, in accordance with some embodiments.

FIG. 7 is a top view illustrating an example of a circuit layout 700 for the first layout cell 600 shown in FIG. 6. The circuit layout 700 includes a semiconductor substrate 702, such as a silicon substrate. Alternatively, the substrate 702 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonite; or combinations thereof. Possible substrates also include a silicon-on-insulator (SOI) substrate.

N-well regions 706 and P-well regions 704 are formed in or on the substrate 702. The N-well and P-well regions 706, 704 may be formed by appropriate processes in which p-type dopants, such as boron or BF2, n-type dopants, such as phosphorus or arsenic, or combinations thereof are employed. The transistors for the buffer 410 and antenna diode 620 are formed in the N-well and P-well regions 706, 704. More specifically, in the example shown in FIG. 7, the N-well region 706 is a region for forming the PMOS transistors 622 and 626 of the first and second inverters 610 and 612. The p-well region 704 is a region for forming the NMOS transistors 624, 628, as well as the NMOS transistor 620 for the antenna diode 520.

The PMOS transistor 622 includes source/drain regions 730, 732, and the PMOS transistor 626 includes source/drain regions 734, 736, which are formed by respective P-diffusions arranged in the N-well region 706. The NMOS transistor 620 forming the antenna diode 520 includes source/drain regions 740, 742. Similarly, the NMOS transistors 624 and 628 include source/drain regions 744, 746 and 748, 750, respectively. The source/drain regions 740, 742, 744, 746, 748, 750 of the NMOS transistors 620, 624, 628 are formed by respective N-diffusions arranged in the P-well region 704.

The NMOS transistor 620 further includes a gate electrode 754 formed by polysilicon ("poly"). The transistors 622 and 624 forming the first inverter of the buffer 410 have a common gate terminal 760 formed by a poly line, and the transistors 626 and 628 forming the second inverter of the buffer 410 have a common gate terminal 762 formed by another poly line.

The input terminal 412 is formed by a metal line 712, the output terminal 414 is formed by a metal line 714, the VDD terminal 416 is formed by a metal line 716, and the VSS or ground terminal 418 is formed by metal lines 718 and 719.

The source/drain region 740 is coupled to the metal line 712 of the input terminal 412. The gate electrode 754 of the NMOS transistor 620 is coupled to the VSS metal lines 718, 719, and the source/drain region 742 of the NMOS transistor 620 is also coupled to the VSS metal lines 718, 719 to form the antenna diode 520.

The source/drain regions 730 and 734 of the PMOS transistors 622 and 626 are coupled to the VDD metal line 716. The source/drain regions 744, 748 of the NMOS transistors 624 and 628 are coupled to the VSS metal lines 718, 719. The common gate terminal 760 of the transistors 622 and 624 forming the first inverter of the buffer 410 is coupled to input metal line 712. The common gate terminal 762 of the transistors 622 and 624 is coupled to the source/drain regions 732 and 746 of the transistors 622 and 624, respectively, by metal lines, for example.

Thus, aspects of the present disclosure provide a standard layout cell for a cell library that keeps an antenna protection device close to an input port of a circuit, such as a buffer circuit. This facilitates more effectively addressing antenna violations, while effectively using chip area by generated designs.

Disclosed embodiments thus include an integrated circuit having a semiconductor substrate with a plurality of circuit elements in or on the substrate. The circuit elements are defined by standard layout cells selected from a cell library. The circuit elements include at least a first circuit element defined by a first standard layout cell from the cell library. The first standard layout cell has a first circuit, such as a buffer circuit, having an input terminal, an output terminal, a first voltage terminal and a second voltage terminal. The first standard layout cell further has an antenna protection circuit, such as an antenna diode, connected between the input terminal and the second voltage terminal.

In accordance with further disclosed embodiments, a method includes providing cell library that has a plurality of standard layout cells. A functional integrated circuit design is received, and a plurality of the standard layout cells are selected from the cell library based on the received functional integrated circuit design. A first standard layout cell from the cell library that is selected based on the received functional integrated circuit design includes a buffer circuit having an input terminal, an output terminal, a first voltage terminal and a second voltage terminal, and an antenna protection circuit connected between the input terminal and the second voltage terminal.

In accordance with still further disclosed embodiments, an integrated circuit design system includes a cell library with a plurality of standard layout cells. The standard layout cells include a first standard layout cell that has a buffer circuit with an input terminal, an output terminal, a first voltage terminal and a second voltage terminal, as well as an antenna protection circuit connected between the input terminal and the second voltage terminal. Computer readable media are accessible by a processor, and the computer readable media stores instructions that when executed implement a method that includes receiving a functional integrated circuit design. Based on the received functional integrated circuit design, a plurality of the standard layout cells are selected from the cell library, including the first standard layout cell. A physical integrated circuit layout is created based on the selected plurality of the standard layout cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a semiconductor substrate;
a plurality of circuit elements in or on the substrate, the circuit elements being defined by standard layout cells selected from a cell library;
the circuit elements including a first circuit element defined by a first standard layout cell from the cell library, the first standard layout cell including a first circuit having an input terminal, an output terminal, a first voltage terminal and a second voltage terminal, wherein the first circuit includes a buffer, wherein the buffer comprises a first inverter and a second inverter, the first inverter including a first PMOS transistor and a first NMOS transistor connected in series between the first and second voltage terminals with gate terminals of the first PMOS transistor and the first NMOS transistor connected to the input terminal, the second inverter including a second PMOS transistor and a second NMOS transistor connected in series between the first and second voltage terminals with gate terminals of the second PMOS transistor and the second NMOS transistor connected to an output terminal of the first inverter, an output terminal of the second inverter connected to the output terminal;
wherein the buffer is a component of a clock tree, and wherein the first and second PMOS transistors and the first and second NMOS transistors are sized to output a first current at the output terminal based on a location of the buffer in the clock tree;
wherein the first standard layout cell integrates an antenna protection circuit connected between the input terminal and the second voltage terminal, the antenna protection circuit including a diode connected between the input terminal and the second voltage terminal; and
wherein the output terminal of the second inverter is configured to directly connect to an input terminal of another buffer of the clock tree.

2. The integrated circuit of claim 1, wherein the second voltage terminal is a ground terminal.

3. The integrated circuit of claim 1, wherein the buffer is configured to provide a delay in a clock signal.

4. The integrated circuit of claim 1, further comprising a plurality of the first circuit elements in the clock tree, and wherein the output terminal of the second inverter of a first one of the plurality of first circuit elements is directly connected to the input terminal of a second one of the plurality of first circuit elements.

5. The integrated circuit of claim 1, wherein output current levels of the first and second PMOS transistors and the first and second NMOS transistors are configured based on the first current.

6. The integrated circuit of claim 1, wherein the cell library includes a plurality of sizes of the first standard layout cell.

7. The integrated circuit of claim 1, wherein the diode is a diode-connected NMOS transistor.

8. A method of designing an integrated circuit, comprising:
providing a cell library including a plurality of standard layout cells;
receiving a functional integrated circuit design;
selecting a plurality of the standard layout cells from the cell library based on the received functional integrated circuit design;
selecting a first standard layout cell from the cell library based on the received functional integrated circuit design that includes a buffer circuit having an input terminal, an output terminal, a first voltage terminal and a second voltage terminal, and integrates an antenna protection circuit connected between the input terminal and the second voltage terminal, the antenna protection circuit including a diode connected between the input terminal and the second voltage terminal, wherein the buffer circuit includes a buffer, wherein the buffer comprises a first inverter and a second inverter, the first inverter including a first PMOS transistor and a first NMOS transistor connected in series between the first and second voltage terminals with gate terminals of the first PMOS transistor and the first NMOS transistor connected to the input terminal, the second inverter including a second PMOS transistor and a second NMOS transistor connected in series between the first and second voltage terminals with gate terminals of the second PMOS transistor and the second NMOS transistor connected to an output terminal of the first inverter, an output terminal of the second inverter connected to the output terminal, and wherein the buffer is a component of a clock tree, and wherein the first and second PMOS transistors and the first and second NMOS transistors are sized to output a first current at the output terminal based on a location of the buffer in the clock tree; and
directly connecting the output terminal of the second inverter to an input terminal of another buffer of the clock tree.

9. The method of claim 8, further comprising:
laying out a plurality of electrical modules on a substrate, wherein at least some of the electrical modules are defined by the standard layout cells, including the first standard layout cell.

10. The method of claim 9, further comprising:
establishing a routing of conductors on the substrate connecting the modules.

11. The method of claim 10, further comprising identifying antenna rule violations based on the routing of the conductors.

12. The method of claim 8, further comprising:
performing a synthesis to create a gate-level netlist;
generating a photolithographic mask based on the gate-level netlist.

13. A system, comprising:
a cell library including a plurality of standard layout cells, the standard layout cells including a first standard layout cell having a buffer circuit with an input terminal, an output terminal, a first voltage terminal and a second voltage terminal, and integrating an antenna protection circuit connected between the input terminal and the second voltage terminal, the antenna protection circuit including a diode connected between the input terminal and the second voltage terminal, wherein the buffer circuit includes a buffer, wherein the buffer comprises a first inverter and a second inverter, the first inverter including a first PMOS transistor and a first NMOS transistor connected in series between the first and second voltage terminals with gate terminals of the first PMOS transistor and the first NMOS transistor connected to the input terminal, the second inverter including a second PMOS transistor and a second NMOS transistor connected in series between the first and second voltage terminals with gate terminals of the second PMOS transistor and the second NMOS transistor connected to an output terminal of the first inverter, an output terminal of the second inverter connected to the output terminal, and wherein the buffer is a component of a clock tree, and wherein the first and second PMOS transistors and the first and second NMOS transistors are sized to output a first current at the output terminal based on a location of the buffer in the clock tree;
a processor;
computer readable media accessible by the processor, the computer readable media storing instructions that when executed implement a method, comprising:
receiving a functional integrated circuit design;
selecting a plurality of the standard layout cells from the cell library based on the received functional integrated circuit design, including the first standard layout cell; and
creating a physical integrated circuit layout based on the selected plurality of the standard layout cells, including directly connecting the output terminal of the second inverter to an input terminal of another buffer of the clock tree.

14. The system of claim 13, wherein a plurality of the first standard layout cells are selected from the cell library based on the received functional integrated circuit design.

15. The system of claim 13, wherein creating the physical integrated circuit layout includes laying out a plurality of electrical modules on a substrate, wherein at least some of the electrical modules are defined by the standard layout cells, including the first standard layout cell.

16. The system of claim 13, wherein the implemented method further comprises:
establishing a routing of conductors on the substrate connecting the modules; and
identifying antenna rule violations based on the routing of the conductors.

17. The system of claim 13, wherein the computer readable media stores the standard cell library.

18. The system of claim 13, wherein output current levels of the first and second PMOS transistors and the first and second NMOS transistors are configured based on the first current.

19. The system of claim 13, wherein the cell library includes a plurality of sizes of the first standard layout cell.

20. The system of claim 13, wherein the diode is a diode-connected NMOS transistor.

* * * * *